United States Patent
Prushinskiy et al.

(10) Patent No.: US 8,835,914 B2
(45) Date of Patent: Sep. 16, 2014

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin (KR)

(72) Inventors: Valeriy Prushinskiy, Yongin (KR); Min-Soo Kim, Yongin (KR); Won-Sik Hyun, Yongin (KR); Heung-Yeol Na, Yongin (KR); Sang-Woo Pyo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/793,138

(22) Filed: Mar. 11, 2013

(65) Prior Publication Data

US 2014/0042402 A1  Feb. 13, 2014

(30) Foreign Application Priority Data

Aug. 7, 2012  (KR) .................. 10-2012-0086229

(51) Int. Cl.
| | | |
|---|---|---|
| *H01L 51/52* | (2006.01) | |
| *H01L 51/56* | (2006.01) | |
| *H01L 51/00* | (2006.01) | |
| *H01L 27/32* | (2006.01) | |

(52) U.S. Cl.
CPC ............ *H01L 51/5203* (2013.01); *H01L 51/56* (2013.01); *H01L 51/0013* (2013.01); *H01L 27/3283* (2013.01); *H01L 27/3246* (2013.01)
USPC ............................................. 257/40; 438/99

(58) Field of Classification Search
USPC .............................................. 257/40; 438/99
See application file for complete search history.

(56) References Cited

U.S. PATENT DOCUMENTS

| 6,919,162 | B1 * | 7/2005 | Brennen et al. | 430/272.1 |
| 2007/0000020 | A1 * | 1/2007 | Vistins et al. | 2/161.1 |
| 2008/0238303 | A1 * | 10/2008 | Lee et al. | 313/504 |
| 2011/0129779 | A1 * | 6/2011 | Lee et al. | 430/312 |
| 2011/0175073 | A1 * | 7/2011 | Chang | 257/40 |

FOREIGN PATENT DOCUMENTS

| JP | 2011-034717 A | 2/2011 |
| KR | 10-0685811 B1 | 2/2007 |
| KR | 10-0742374 B1 | 7/2007 |

* cited by examiner

*Primary Examiner* — Daniel Shook
(74) *Attorney, Agent, or Firm* — Robert E. Bushnell, Esq.

(57) ABSTRACT

An organic light emitting display device may include a first substrate, a first electrode disposed on the first substrate, a pixel defining layer disposed on the first electrode and the first substrate, an organic light emitting structure disposed on the first electrode, a second electrode disposed on the organic light emitting structure and the pixel defining layer, a second substrate disposed on the second electrode, etc. The pixel defining layer may include a fine uneven structure positioned in the display and the non-display regions. The organic light emitting structure may be substantially uniformly formed on the first electrode through the pixel defining layer having the fine uneven structure, so that an organic light emitting display device may exhibit increased lifetime and may show improved image quality.

20 Claims, 3 Drawing Sheets

ORGANIC LIGHT EMITTING DISPLAY DEVICES AND METHODS OF MANUFACTURING ORGANIC LIGHT EMITTING DISPLAY DEVICES

CLAIM OF PRIORITY

This application makes reference to, incorporates the same herein, and claims all benefits accruing under 35 U.S.C. §119 from an application for ORGANIC LIGHT EMITTING DISPLAY DEVICES AND METHODS OF MANUFACTURING ORGANIC LIGHT EMITTING DISPLAY DEVICES earlier filed in the Korean Intellectual Property Office on 7 Aug. 2012 and there duly assigned Serial No. 10-2012-0086229.

BACKGROUND OF THE INVENTION

1. Field of the Invention

Example embodiments of the invention relate to organic light emitting display (OLED) devices and methods of manufacturing organic light emitting display devices. More particularly, example embodiments of the invention relate to organic light emitting display devices including uniform organic light emitting structures formed by pixel defining layers having fine uneven structures and methods of manufacturing the organic light emitting display devices.

2. Description of the Related Art

Generally, an organic light emitting display device displaying color images may include a lower electrode disposed over a substrate, a pixel defining layer formed on the lower electrode, organic layers formed on the pixel defining layer and the lower electrode, and an upper electrode positioned on the organic layers and the pixel defining layer. The pixel defining layer may be located on an insulation layer covering an underlying structure and the lower electrode, and the pixel defining layer may insulate the organic layers of adjacent pixels while defining a display region of the organic light emitting display device.

In the display region defined by the pixel defining layer, the organic layers may include a red organic light emitting layer (EL), a green organic light emitting layer and a blue organic light emitting layer in accordance with color pixels, and the organic layers may additionally include a hole injection layer (HIL), an electron injection layer (EIL), a hole transfer layer (HTL), an electron transfer layer (ETL), etc. Here, the organic light emitting layer may be formed using an organic polymer or an organic material having relatively low molecular weight.

Typically, the organic layers may be formed by a laser induced thermal imaging (LITI) process in which organic transfer layers of a donor substrate including a light to heat conversion layer and the organic transfer layers may be transferred onto the lower electrode of the organic light emitting display device. In the laser induced thermal imaging process, the donor substrate may be laminated on the pixel defining layer and laser energy may be applied to the donor substrate so that the organic transfer layers may be expanded and detached from the donor substrate. Thus, the organic layers may be formed on the portion of the lower electrode left exposed within and surrounded by the pixel defining layer by transfer of organic layers that detach from the donor substrate. However, in the conventional method of manufacturing the organic light emitting display device, gases may easily remain trapped at both end portions of the display region (i.e., on both of the end portions of the lower electrode). The remaining trapped gas on the lower electrode surface may prevent the organic layers from being properly formed on the lower electrode and specifically on the end portions of the display region. This failure of the organic layers to adhere may be referred to as "edge open failure". When edge open failure occurs in the display region, the lifetime of the organic light emitting display device may be reduced, and the uniformity of images displayed by the organic light emitting display device may be deteriorated.

SUMMARY OF THE INVENTION

Example embodiments provide an organic light emitting display device including a pixel defining layer having a fine uneven structure for improved lifetime and enhanced quality of images.

Example embodiments provide a method of manufacturing an organic light emitting display device. The method includes forming a pixel defining layer having a fine uneven structure, which has the effect of enhancing the quality of images displayed by improving the surface uniformity of the organic light emitting structure of the device, thereby increasing the lifetime of the organic light emitting display device.

According to example embodiments, there is provided an organic light emitting display device including a first substrate, a first electrode disposed on the first substrate, a pixel defining layer disposed on the first electrode and the first substrate, an organic light emitting structure disposed on the first electrode, a second electrode disposed on the organic light emitting structure and the pixel defining layer, a second substrate disposed on the second electrode, etc. The pixel defining layer may define a display region and a non-display region. The pixel defining layer may include a fine uneven structure positioned in the display and the non-display regions.

In example embodiments, each of the first electrode and the second electrode may include one of a material having a reflectivity and a material having a transmittance. For example, the first electrode may include aluminum (Al), silver (Ag), platinum (Pt), gold (Au), chromium (Cr), tungsten (W), molybdenum (Mo), titanium (Ti), palladium (Pd), iridium (Ir), an alloy thereof, etc. The second electrode may include indium tin oxide (ITO), indium zinc oxide (IZO), indium gallium oxide (IGO), zinc oxide (ZnOx), gallium oxide (GaOx), tin oxide (SnOx), etc.

In some example embodiments, the first electrode may include indium tin oxide (ITO), indium zinc oxide (IZO), indium gallium oxide (IGO), zinc oxide (ZnOx), gallium oxide (GaOx), tin oxide (SnOx), etc. The second electrode may include aluminum (Al), silver (Ag), platinum (Pt), gold (Au), chromium (Cr), tungsten (W), molybdenum (Mo), titanium (Ti), palladium (Pd), iridium (Ir), an alloy thereof, etc.

In example embodiments, the pixel defining layer may include an opening exposing the first electrode in the display region, and the fine uneven structure may be positioned on a sidewall of the opening forming the display region and also on the pixel defining layer in the non-display region.

In example embodiments, the fine uneven structure may include one of a plurality of trenches and a plurality of grooves, and the one of a plurality of trenches and a plurality of grooves may be arranged in a predetermined direction.

In some example embodiments, the fine uneven structure may include one of a plurality of trenches, a plurality of grooves and a plurality of dents, any of which may be arranged along a plurality of directions.

In some example embodiments, one of the trenches, the grooves and the dents may be partly or entirely communicated with one another.

In example embodiments, the pixel defining layer may include one of an organic material and an inorganic material. For example, the pixel defining layer may comprise benzocyclobutene (BCB), photoresist, phenol-based resin, poly-acryl-based resin, polyimid-based resin, acryl-based resin, silicon oxide (SiOx), silicon nitride (SiNx), silicon oxynitride (SiOxNy), silicon oxycarbide (SiOxCy), etc.

According to example embodiments, there is provided a method of manufacturing organic light emitting display devices. According to the method, a first substrate may be provided. A first electrode may be formed on the first substrate. A pixel defining layer may be formed on the first electrode and on the first substrate to define a display region and a non-display region. A fine uneven structure may be formed within the pixel defining layer to be disposed in the display and the non-display regions. An organic light emitting structure may be formed on the first electrode. A second electrode may be formed on the organic light emitting structure and the pixel defining layer. A second substrate may be formed on the second electrode.

In example embodiments, an underlying structure including a switching device and an insulation layer may be formed between the first substrate and the first electrode.

In the formation of the pixel defining layer according to example embodiments, an opening exposing the first electrode may be formed in the display region by partially etching the pixel defining layer. The fine uneven structure may be formed on a sidewall of the opening in the display region and on the pixel defining layer in the non-display region.

In the formation of the fine uneven structure according to example embodiments, a roller having bristles arranged in a predetermined direction may contact the pixel defining layer while the pixel defining layer, carried by the first substrate, moves translationally relative to the roller.

In another method of forming the fine uneven structure according to example embodiments, a laser may be irradiated onto the pixel defining layer using a mask having micro holes arranged in a predetermined direction while moving the first substrate translationally relative to the laser.

In the formation of the fine uneven structure according to example embodiments, a roller having bristles arranged in a predetermined direction may contact the pixel defining layer while the first substrate moves translationally relative to the roller in a first direction, and then the roller may contact the pixel defining layer while moving the first substrate in a second direction different from the first direction.

In the formation of the fine uneven structure according to example embodiments, a laser may be irradiated onto the pixel defining layer using a mask having micro holes arranged in a predetermined direction while moving the first substrate in a first direction, and then a laser may be irradiated onto the pixel defining layer using the mask while moving the first substrate along a second direction different from the first direction.

In example embodiments, the organic light emitting structure may be formed by a laser induced thermal imaging process using a donor substrate having an organic transfer layer. Trapped air or gases in the opening of the pixel defining layer may be exhausted through the fine uneven structure during the laser induced thermal imaging process that transfers the organic transfer layer from the donor substrate to the first electrode surface within the opening in the pixel defining layer.

According to example embodiments, the organic light emitting structure may be substantially uniformly formed on a display substrate through the pixel defining layer including the fine uneven structure having the plurality of trenches, the plurality of grooves or the plurality of dents, which are arranged in a predetermined direction or various directions. Therefore, the organic light emitting display device including the organic light emitting structure may ensure increased lifetime, and also may improve the quality of images displayed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to", or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include a plurality of forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature, and their shapes are not intended to illustrate the actual shapes of regions of devices and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
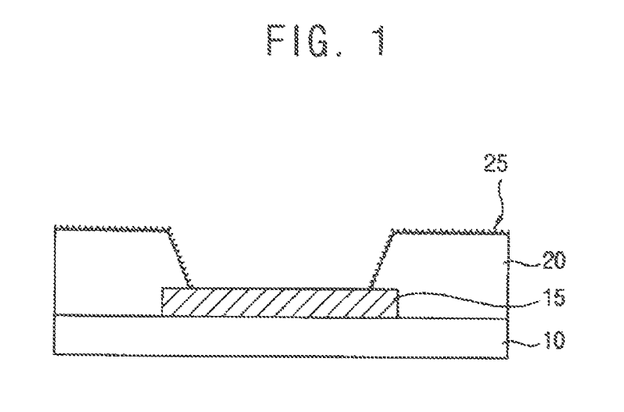
FIG. 1 is a cross-sectional view illustrating a display substrate of an organic light emitting display device including a pixel defining layer in accordance with example embodiments.
Figure 2:
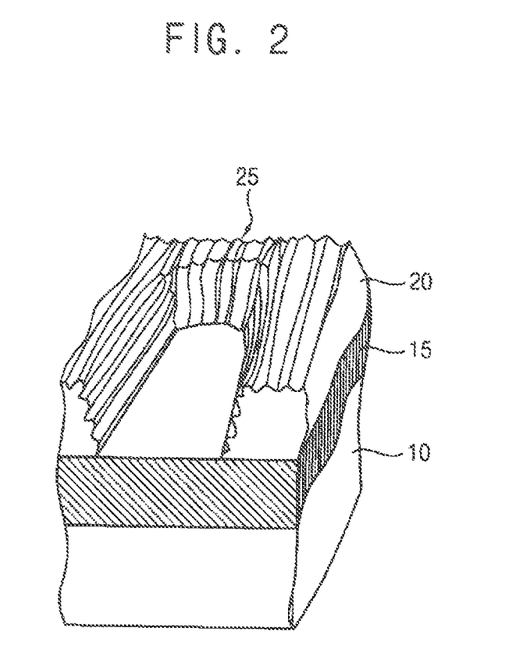
FIG. 2 is a partially cut perspective view illustrating a display substrate of an organic light emitting display device including a pixel defining layer in accordance with example embodiments.

FIG. 1 is a cross-sectional view illustrating a display substrate of an organic light emitting display device including a pixel defining layer in accordance with example embodiments. FIG. 2 is a partially cut perspective view illustrating a display substrate of an organic light emitting display device including a pixel defining layer in accordance with example embodiments.

Referring to FIG. 1, an organic light emitting display device in accordance with example embodiments may include a first substrate 10, a first electrode 15, a pixel defining layer 20, etc. Although it is not illustrated, the organic light emitting display device may include an organic light emitting structure provided on the first electrode 15, a second electrode disposed on the organic light emitting structure and the pixel defining layer 20, a second substrate positioned on the second electrode, etc.

The first substrate 10 may include an insulation substrate. For example, the first substrate 10 may include a glass substrate, a quartz substrate, a transparent resin substrate, a metal oxide substrate, etc. In some example embodiments, the first substrate 10 may include a flexible substrate.

Although it is not illustrated, a switching device may be provided on the first substrate 10. In example embodiments, the switching device may include a thin film transistor (TFT), an oxide semiconductor device, etc. When the switching device includes a TFT, the first electrode 15 may be electrically connected to a drain electrode of the TFT. Here, at least one insulation layer may be disposed between the switching device and the first electrode 15. The at least one insulation layer may include an organic material. For example, the insulation layer may include photoresist, acryl-based polymer, polyimide-based polymer, polyamide-based polymer, siloxane-based polymer, novolak resin, alkali-soluble resin, etc. These may be used alone or in combination. In some example embodiments, the insulation layer may be formed using an inorganic material such as silicon compound, metal, metal oxide, etc. For example, the insulation layer may include silicon oxide (SiOx), silicon nitride (SiNx), silicon oxynitride (SiOxNy), silicon oxycarbide (SiOxCy), silicon carbon nitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), magnesium oxide (MgOx), zinc oxide (ZrOx), hafnium oxide (HfOx), zirconium oxide (ZrOx), titanium oxide (TiOx), tantalum oxide (TaOx), etc. These may be used alone or in combination.

Referring now to FIG. 1, the first electrode 15 may be disposed on the first substrate 10, interposing at least one insulation layer therebetween. According to the emission type of the organic light emitting display device, the first electrode 15 may include a material having a reflectivity or a transmittance. For example, when the organic light emitting display device has a top-emission type, the first electrode 15 may include aluminum (Al), silver (Ag), platinum (Pt), gold (Au), chromium (Cr), tungsten (W), molybdenum (Mo), titanium (Ti), palladium (Pd), iridium (Ir), an alloy thereof, etc. These may be used alone or in combination. The first electrode 15 may have a single layer structure or a multi layer structure, which may include a metal film and/or an alloy film. Meanwhile, when the organic light emitting display device has a bottom-emission type, the first electrode 15 may include a transparent conductive oxide such as indium tin oxide (ITO), indium zinc oxide (IZO), indium gallium oxide (IGO), zinc oxide (ZnOx), gallium oxide (GaOx), tin oxide (SnOx), etc.

Referring to FIGS. 1 and 2, the pixel defining layer 20 may be disposed on the first substrate 10 to partially expose the first electrode 15. For example, the pixel defining layer 20 may include benzocyclobutene (BCB), photoresist, phenol-based resin, polyacryl-based resin, polyimide-based resin, acrylic-based resin, etc. In some example embodiments, the pixel defining layer 20 may include an inorganic material. For example, the pixel defining layer 20 may include silicon oxide (SiOx), silicon nitride (SiNx), silicon oxynitride (SiOxNy), silicon oxycarbide (SiOxCy), etc.

The pixel defining layer 20 may define a display region and a non-display region of the organic light emitting display device. The pixel defining layer 20 may have an opening which exposes a portion of the first electrode 15. The opening of the pixel defining layer 20 may substantially define the display region and the non-display region of the organic light emitting display device. For example, a portion of the display panel 10 having the opening of the pixel defining layer 20 may be the display region while another portion of the display panel 10 substantially surrounding the opening of the pixel defining layer 100 may be the non-display region. The opening of the pixel defining layer 20 may be formed through a dry etching process or a wet etching process depending upon the composition of the pixel defining layer 20. In the wet etching process for forming the opening of the pixel defining layer 20, the pixel defining layer 20 may be partially etched using an etchant in an etching process conducted at a temperature below about 200° C. to thereby form the opening partially exposing the first electrode 15.

The opening of the pixel defining layer 20 may have a sidewall inclined by a predetermined angle relative to the first substrate 10, forming a bowl with the central first electrode surface at its base. For example, the opening of the pixel defining layer 20 may have an upper width substantially larger than a lower width thereof, the lower width being at the base of the bowl and adjacent to the first electrode surface.

In example embodiments, the pixel defining layer 20 may include a fine uneven structure 25. The fine uneven structure 25 may be formed on the sidewall of the opening of the pixel defining layer 20 positioned in the display region and on the pixel defining layer located in the non-display region. As illustrated in FIG. 2, the fine uneven structure 25 may include a plurality of trenches or a plurality of grooves, which may extend along a predetermined direction. In this case, the trenches or the grooves may have substantially the same size. Alternatively, the trenches or the grooves may have different sizes, respectively. For example, adjacent trenches or adjacent grooves may have substantially the same width and depth or may have different widths and depths.

Figure 3:
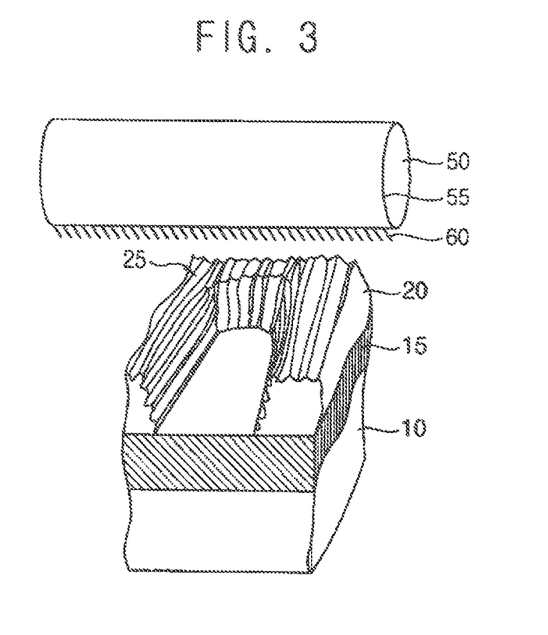
FIG. 3 is a partially cut perspective view illustrating processes for forming a fine uneven structure on a pixel defining layer in accordance with example embodiments.

FIG. 3 is a partially cut perspective view illustrating processes for forming a fine uneven structure on a pixel defining layer in accordance with example embodiments.

Referring to FIGS. 2 and 3, the fine uneven structure 25 may be formed on the pixel defining layer 20 including the organic material using a roller 50 having a base 55 with bristles 60 arranged in a predetermined direction. For example, the first substrate 10 having the pixel defining layer 20 may be placed on a supporting plate (not illustrated), and then the rotating roller 50 may contact the pixel defining layer 20 while the first substrate 10 moves translationally relative to the roller, so that the plurality of trenches or the plurality of grooves may be formed on the pixel defining layer 10. Thus, the fine uneven structure 25 having the plurality of trenches or the plurality of grooves, which trenches or grooves may extend along the predetermined direction, may be formed on the pixel defining layer 10. Here, the trenches or the grooves may be simultaneously formed on the sidewall of the opening of the pixel defining layer 20 and on other portions of the pixel defining layer 20 by adjusting arrangement and sizes of the bristles 60.

In some example embodiments, when the pixel defining layer 20 includes an inorganic material, the fine uneven structure 25 may be formed on the pixel defining layer 20 through a laser irradiation process using a mask (not illustrated) having micro holes arranged in a linear fashion in a predetermined direction. For example, the mask having micro holes may be placed over the pixel defining layer 20, and then a laser may be irradiated on the pixel defining layer 20 through the mask while moving the first substrate 10 in a direction perpendicular to the predetermined direction, so that the plurality of trenches or the plurality of grooves may be formed on the pixel defining layer 20. In this case, each of the micro holes of the mask may have a diameter substantially smaller than the width of each trench or the width of each groove.

In a laser induced thermal imaging (LITI) process for forming an organic light emitting structure (not illustrated) on the first electrode 15 in the display region, the organic light emitting structure may be formed on the first electrode 15 while a donor substrate (not illustrated) having an organic transfer layer may move in a direction parallel to the plane of the substrate surface, the two substrates being disposed such that their parallel surfaces with attached layered materials interface, and substantially opposite to a direction in which the first substrate 10 moves. In this case, air or other gases may remain at both sides of the first electrode 15 (e.g., both sides of the opening of the pixel defining layer 20). When the laser induced thermal imaging (LITI) process is performed under the conditions in which the air or other gases remain on the first electrode 15, the organic light emitting structure may not be formed on both sides of the portion of the surface of the first electrode 15 that is exposed within the opening in the pixel defining layer. However, when the fine uneven structure 25 having the trenches or the grooves is provided on the pixel defining layer 20 as described above, the organic light emitting structure may be uniformly formed on the first electrode 15 because the air or the gases remaining on the first electrode 15 may be exhausted from the opening of the pixel defining layer 20 during the laser induced thermal imaging (LITI) process. Here, the trenches or the grooves may extend along a direction substantially parallel to a direction in which the first substrate 10 moves or the donor substrate moves in the laser induced thermal imaging (LITI) process. Thus, the air or the remaining gases may be easily exhausted from the opening of the pixel defining layer 20 along the trenches or the grooves formed in the pixel defining layer. As a result, the organic light emitting display device structure of the present invention may exhibit improved quality of images by reason of having the organic light emitting structure formed uniformly throughout the display region, and such a structure also may ensure a more extended device lifetime.

Although it is not illustrated in FIG. 1, the second electrode may be disposed on the organic light emitting structure positioned on the first electrode 15 in the display region. As described above, the organic light emitting structure formed from the organic transfer layer of the donor substrate may include a multi-layer structure which may have an organic light emitting layer (EL), a hole injection layer (HIL), a hole transfer layer (HTL), an electron transfer layer (ETL), an electron injection layer (EIL), etc. The organic light emitting structure may include light emitting materials for generating different colors of light such as a red color (R) of light, a green color (G) of light and a blue color (B) of light in accordance with pixels of the organic light emitting display device. In some example embodiments, the organic light emitting structure may include a plurality of stacked light emitting materials for generating a red color of light, a green color of light and a blue color of light to thereby emit a white color of light.

Substantially similar to the first electrode 15, the second electrode may include a transparent material or a reflective material in accordance with the emission type of the organic light emitting display device. For example, when the organic light emitting display device is of the top-emission type, the second electrode may include a transparent conductive oxide such as indium tin oxide (ITO), indium zinc oxide (IZO), indium gallium oxide (IGO), zinc oxide (ZnOx), gallium oxide (GaOx), tin oxide (SnOx), etc. Alternatively, when the organic light emitting display device is of the bottom-emission type, the second electrode may include aluminum (Al), silver (Ag), platinum (Pt), gold (Au), chromium (Cr), tungsten (W), molybdenum (Mo), titanium (Ti), palladium (Pd), iridium (Ir), an alloy thereof, etc. These may be used alone or in combination.

The second substrate disposed on the second electrode may include an insulation substrate. For example, the second substrate may include a glass substrate, a quartz substrate, a transparent resin substrate, a metal oxide substrate, etc. Alternatively, the second substrate may include a flexible substrate.

Figure 4:
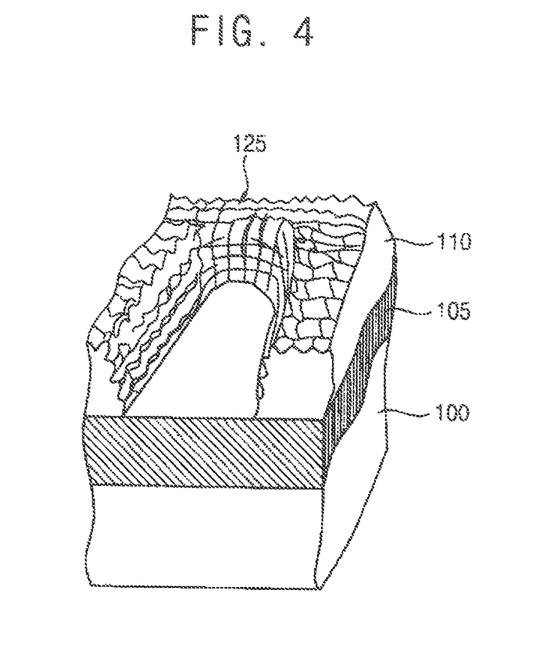
FIG. 4 is a partially cut perspective view illustrating a display substrate of an organic light emitting display device including a pixel defining layer in accordance with some example embodiments.

FIG. 4 is a partially cut perspective view illustrating a display substrate of an organic light emitting display device including a pixel defining layer in accordance with some example embodiments. As for the display substrate illustrated in FIG. 4, detailed descriptions of elements substantially the same as those of the display substrate in FIG. 2 will be omitted.

Referring to FIG. 4, the organic light emitting display device in accordance with some example embodiments may include a first substrate 100, a first electrode 105, a pixel defining layer having a fine uneven structure 125, etc. Although it is not illustrated, the organic light emitting display device may additionally include an organic light emitting structure, a second electrode, a second substrate, etc.

The first substrate 100 may include an insulation substrate and the first electrode 105 may include a material having a reflectivity or a transmittance according to the emission type of the organic light emitting display device. Here, an underlying structure (not illustrated), which may include a switching device, a contact, a pad, a conductive pattern, a conductive line, an insulation layer, etc., may be provided between the first substrate 100 and the first electrode 105.

The pixel defining layer 110 may be positioned on the first substrate 100 and the first electrode 105. The pixel defining layer 110 may define a display region and a non-display region of the organic light emitting display device. The pixel defining layer 110 may include an opening which partially exposes the first electrode 105. The fine uneven structure 125 may be formed on a sidewall of the opening of the pixel defining layer 110 and other portions of the pixel defining layer 110. That is, the fine uneven structure 125 may be positioned in both the display region and the non-display region.

In example embodiments, the fine uneven structure 125 may include trenches, grooves or dents, any of which may be arranged along a plurality of directions. Here, the trenches, the grooves or the dents of the fine uneven structure 125 may be partially or entirely communicated with one another. For example, adjacent trenches, adjacent grooves or adjacent dents may be partially or entirely connected with one another.

When the fine uneven structure 125 includes an organic material, the fine uneven structure 125 having the trenches, the grooves or the dents arranged in various directions may be formed on the pixel defining layer 110 using a cylindrical roller including bristles arranged in linear or spiral-linear fashion along a plurality of directions substantially parallel to each other or substantially perpendicular to each other. In some example embodiments, the fine uneven structure 125 having the trenches, the grooves or the dents arranged in the plurality of directions may be obtained by repeatedly performing a process using a roller having bristles arranged in a predetermined direction. For example, a plurality of trenches or a plurality of grooves extending along a first direction may be formed on the pixel defining layer 110 using the roller while moving the first substrate 100 in the first direction, and then a plurality of trenches or a plurality of grooves extending along a second direction may be formed on the pixel defining layer 110 using the roller while moving the first substrate 100 in the second direction. Here, the first direction is substantially different from the second direction. For example, the first direction may be substantially perpendicular to the second direction or the first direction may form predetermined non-perpendicular angles with the second direction. Thus, the fine uneven structure 125 having the trenches, the grooves or the dents arranged in the various directions may be provided on the pixel defining layer 110.

Meanwhile, when the pixel defining layer 110 includes an inorganic material, the fine uneven structure 125 may be formed on the pixel defining layer 110 through a laser irradiation process using a mask having micro holes arranged in a plurality of directions. For example, the mask having the micro holes arranged in various directions may be placed over the pixel defining layer 110, and then a laser may be irradiated onto the pixel defining layer 110 through the mask while moving the first substrate 100 in a predetermined direction. Thus, the fine uneven structure 125 having a plurality of trenches, a plurality of grooves or a plurality of dents may be formed on the pixel defining layer 110. Additionally, the fine uneven structure 125 having the plurality of trenches, the plurality of grooves or the plurality of dents may be formed by repeatedly performing the laser irradiation process using a mask having a plurality of micro holes arranged in a predetermined direction. For example, the laser irradiation process using the mask having the plurality of the micro holes arranged in the predetermined direction may be executed on the pixel defining layer 110 while moving the first substrate 100 in a first direction, and then the laser irradiation process may be performed again on the pixel defining layer 110 while moving the first substrate 100 in a second direction, so that the fine uneven structure 125 having the trenches, the grooves or the dents arranged in various directions may be formed on the pixel defining layer 110.

As described above, the pixel defining layer 110 may include the fine uneven structure 125, such that the organic light emitting structure may be uniformly formed on the first electrode 105 because air or gases remaining on the opening of the pixel defining layer 110 may be exhausted through the fine uneven structure 125 in forming the organic light emitting structure on the first electrode 105 by a laser induced thermal imaging process using a donor substrate. Therefore, the organic light emitting structure display device may ensure improved lifetime and also may improve the quality of images displayed.

Figure 5:
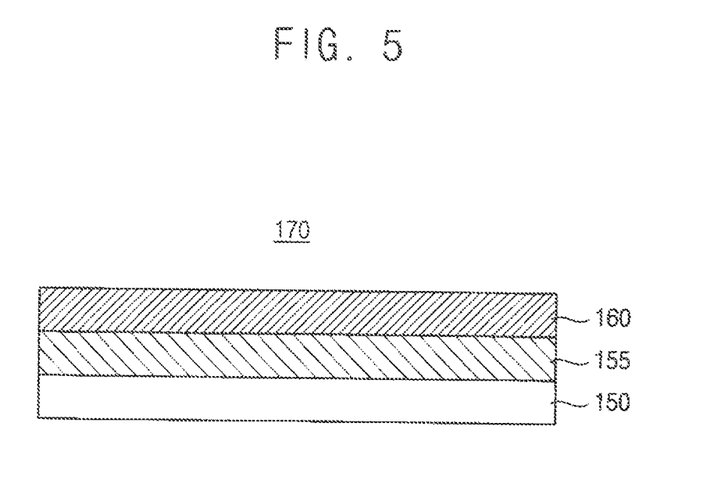
FIG. 5 is a cross-sectional view illustrating a donor substrate in accordance with example embodiments.

FIG. 5 is a cross-sectional view illustrating a donor substrate in accordance with example embodiments.

Referring to FIG. 5, a donor substrate according to example embodiments may include a base film 160, a light to heat conversion layer 155, an organic transfer layer 150, etc.

The base film 160 may include a material having a predetermined flexibility and a predetermined strength. For example, the base film 160 may include a transparent polymer such as polyethylene terephthalate, polyester, polyacryl, polyepoxy, polyethylene, polystyrene, etc. When the base film 160 has a relatively small thickness, handling of the donor substrate 170 may be difficult. Further, when the base film 160 has a relatively large thickness, loading and transferring of the donor substrate 170 may be difficult because of a relatively high weight of the donor substrate 170. Thus, the base film 160 may advantageously have a thickness of about 10 μm to about 500 μm. The base film 160 may support elements of the donor substrate 170.

The light to heat conversion layer 155 may be disposed on the base film 160. The light to heat conversion layer 155 may include an optical absorption material capable of converting laser irradiation into thermal energy. In example embodiments, the light to heat conversion layer 155 may include a film containing metal including aluminum (Al), molybdenum (Mo), an oxide thereof, a sulfide thereof, etc. Here, the film containing metal may have a relatively small thickness of about 10 μm to about 500 μm. In some example embodiments, the light to heat conversion layer 155 may include a film containing an organic material to which carbon black, graphite and/or an infrared dye may be added. Here, the layer containing an organic material may have a relatively large thickness of about 10 μm. The thermal energy generated by the laser irradiated onto the light to heat conversion layer 155 may change an adhesion strength between the organic transfer layer 150 and the light to heat conversion layer 155, and thus the thermal energy generated by the laser irradiated onto the light to heat conversion layer 155 may transfer the organic transfer layer 150 onto a display substrate in a predetermined pattern structure.

In some example embodiments, a buffer layer (not illustrated) may be additionally disposed between the light to heat conversion layer 155 and the organic transfer layer 150. For example, the buffer layer may have a thickness about 5 μm to about 300 μm.

Referring now to FIG. 5, the organic transfer layer 150 may be disposed on the light to heat conversion layer 155. The organic light emitting structure may be formed on the display substrate by a laser induced thermal imaging process using the donor substrate 170 having the organic transfer layer 150. In example embodiments, the organic transfer layer 150 may include an organic light emitting layer (EL), a hole injection layer (HIL), a hole transfer layer (HTL), an electron transfer layer (ETL), an electron injection layer (EIL), etc. The organic light emitting structure including a plurality of the organic layers may be formed on the display substrate from the organic transfer layer 150 having a multi layer structure.

Figure 6:
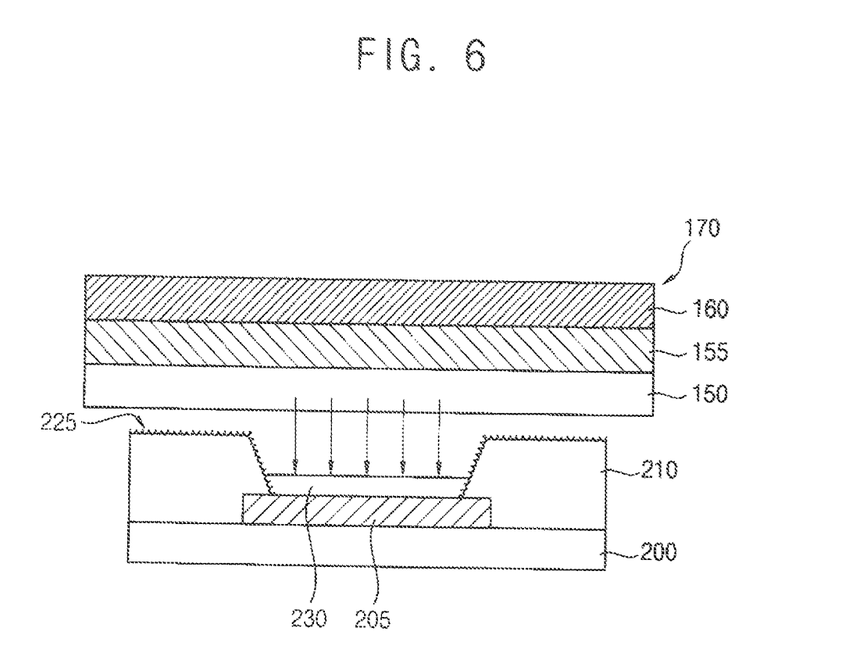
FIG. 6 is a cross-sectional view illustrating a method of manufacturing an organic light emitting display device in accordance with exemplary embodiments.

FIG. 6 is a cross-sectional view illustrating a method of manufacturing an organic light emitting display device in accordance with example embodiments. FIG. 6 illustrates the method of manufacturing the organic light emitting display device having a configuration that is substantially the same as or substantially similar to that of the organic light emitting display device described with reference to FIG. 1. An organic light emitting display device having a configuration that is substantially the same as or substantially similar to that of the organic light emitting display device described with reference to FIG. 4 may also be obtained by forming a fine uneven structure 225 on pixel defining layer 210 as previously described for the formation of fine uneven structure 125 on pixel defining layer 110.

Referring to FIG. 6, the first electrode 205 may be formed on the first substrate 200. The first substrate 200 may include an insulation substrate. In example embodiments, before forming the first electrode 205, an underlying structure having a switching device, an insulation layer, a contact, etc., may be formed on the first substrate 200. In this case, the first electrode 205 may make electrical contact with the switching device. When the switching device includes a thin film transistor (TFT), the switching device may include a gate insulation layer, a gate electrode, a source electrode, a drain electrode, a semiconductor pattern, etc.

In example embodiments, the first electrode 205 may be an anode providing holes to an organic light emitting structure 230. Depending upon the emission type of the organic light emitting display device, the first electrode 205 may be a transmissive electrode or a reflective electrode. For example, the first electrode 205 may be formed using a transparent conductive material, a metal having a reflectivity, an alloy having a reflectivity, etc.

The pixel defining layer 210 may be formed on the first substrate 200 and the first electrode 205. The pixel defining layer 210 may be formed using an organic material or an inorganic material. The pixel defining layer 210 may be partially etched to thereby form an opening partially exposing the first electrode 205. With the formation of the opening through the pixel defining layer 210, the pixel defining layer 210 may define a display region and a non-display region of the organic light emitting display device.

In example embodiments, as described above, the fine uneven structure 225 may be formed on the pixel defining layer 210 by performing a process using a roller or a laser depending upon the materials used to form the pixel defining layer 210. The fine uneven structure 225 may be formed on a sidewall of the opening in the display region and on the pixel defining layer 210 in the non-display region. The fine uneven structure 225 may include a plurality of trenches or a plurality of grooves, either of which may extend along a predetermined direction. Alternatively, the fine uneven structure 225 may include a plurality of trenches, a plurality of grooves or a plurality of dents, any of which may extend along various directions.

Referring now to FIG. 6, the donor substrate 170 described with reference to FIG. 5 may be laminated on the pixel defining layer 210 having the fine uneven structure 225. In example embodiments, the first substrate 200 may be supported on a supporting member (not illustrated), and then the donor substrate 170 may be aligned relative to the first substrate 200. Then, the donor substrate 170 may be laminated on the pixel defining layer 210 by pressing the donor substrate 170 using a suitable process.

As illustrated using arrows in FIG. 6, the organic transfer layer 150 of the donor substrate 170 may be transferred onto the exposed first electrode 205 on the first substrate 200 by irradiating a laser onto the donor substrate 170. In this case, the laser may be irradiated onto a portion of the donor substrate 170 corresponding to the display region in which the first electrode 205 is located. For example, the laser irradiation may come from a laser source such as a xenon (Xe) lamp, a flash lamp, etc.

In a laser induced thermal imaging process, when the laser may be irradiated onto the portion of the donor substrate 170, an adhesion strength between the organic transfer layer 150 and the first electrode 205 may be substantially larger than the adhesion strength attaching the light to heat conversion layer 155 to the organic transfer layer 150. Thus, the organic light emitting structure 230 may be formed on the first electrode 205 in the display region by separating the organic transfer layer 150 from the light to heat conversion layer 155, onto which the laser is irradiated. Here, the organic light emitting structure 230 may have a multi layer structure which may include an organic light emitting layer (EL), a hole injection layer (HIL), a hole transfer layer (HTL), an electron transfer layer (ETL), an electron injection layer (EIL), etc. Further, the organic light emitting layer of the organic light emitting structure 230 may include light emitting materials for generating different colors of light, such as a red color (R) of light, a green color (G) of light and a blue color (B) of light in accordance with color pixels of the organic light emitting display device. Alternatively, the organic light emitting layer of the organic light emitting structure 230 may include a plurality of stacked light emitting materials for generating a red color of light, a green color of light and a blue color of light, to thereby emitting a white color of light.

In accordance with example embodiments, the organic light emitting structure 230 may be uniformly formed on the first electrode 205 because, with fine uneven structure 225 included on pixel defining layer 210, air or gases remaining in the opening of the pixel defining layer 210 may be exhausted through the fine uneven structure 225 during the forming of the organic light emitting structure 230 on the first electrode 205 by the laser induced thermal imaging process using the donor substrate 170. As a result, the organic light emitting structure display device may exhibit increased lifetime and also may show improved quality in the images displayed.

Although not illustrated in FIG. 6, the second electrode may be formed on the organic light emitting structure 230 and the pixel defining layer 210, and the second substrate may be disposed on the second electrode. According to the emission type of the organic light emitting display device, the second electrode may be formed using a metal having a reflectivity, an alloy having a reflectivity, a transparent conductive material, etc. The second substrate may include a transparent insulation substrate.

According to example embodiments of the invention, an organic light emitting structure may be substantially uniformly formed on a display substrate by means of a pixel defining layer including a fine uneven structure so that an organic light emitting display device including the organic light emitting structure may show improved lifetime and may enhance the quality of images displayed. Organic light emitting display devices having improved lifetime and improved quality of images may be advantageously employed in various electronic and electric apparatuses such as televisions, mobile phones, portable display apparatuses, medical apparatuses, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An organic light emitting display device, comprising:
a first substrate;
a first electrode disposed on the first substrate;
a pixel defining layer disposed on the first electrode and the first substrate to define a display region and a non-display region, the pixel defining layer including an opening exposing the first electrode in the display region, the pixel defining layer including a fine uneven structure positioned in the display and the non-display regions, the fine uneven structure comprising pathways for exhaustion of gases from within the opening;
an organic light emitting structure disposed on the first electrode;
a second electrode disposed on the organic light emitting structure and the pixel defining layer; and
a second substrate disposed on the second electrode.

2. The organic light emitting display device of claim 1, each of the first electrode and the second electrode including one of a material having a reflectivity and a material having a transmittance.

3. The organic light emitting display device of claim 2, the first electrode including at least one selected from aluminum (Al), silver (Ag), platinum (Pt), gold (Au), chromium (Cr), tungsten (W), molybdenum (Mo), titanium (Ti), palladium (Pd), iridium (Ir) and an alloy thereof, and the second electrode including one selected from indium tin oxide (ITO), indium zinc oxide (IZO), indium gallium oxide (IGO), zinc oxide (ZnOx), gallium oxide (GaOx) and tin oxide (SnOx).

4. The organic light emitting display device of claim 2, the first electrode including one selected from indium tin oxide (ITO), indium zinc oxide (IZO), indium gallium oxide (IGO), zinc oxide (ZnOx), gallium oxide (GaOx) and tin oxide (SnOx), and the second electrode including at least one selected from aluminum (Al), silver (Ag), platinum (Pt), gold (Au), chromium (Cr), tungsten (W), molybdenum (Mo), titanium (Ti), palladium (Pd), iridium (Ir) and an alloy thereof.

5. The organic light emitting display device of claim 1, the fine uneven structure being positioned on a sidewall of the opening and on the pixel defining layer in the non-display region.

6. The organic light emitting display device of claim 5, the fine uneven structure including one of a plurality of trenches and a plurality of grooves, the one of a plurality of trenches and a plurality of grooves being arranged in a predetermined direction.

7. The organic light emitting display device of claim 5, the fine uneven structure including one of a plurality of trenches, a plurality of grooves and a plurality of dents, the one of a plurality of trenches, a plurality of grooves and a plurality of dents being arranged in a plurality of directions.

8. The organic light emitting display device of claim 7, one of the trenches, the grooves and the dents being partly or entirely communicated with one another.

9. The organic light emitting display device of claim 5, the pixel defining layer including one of an organic material and an inorganic material.

10. The organic light emitting display device of claim 9, the pixel defining layer comprising one of benzocyclobutene (BCB), photoresist, phenol-based resin, polyacryl-based resin, polyimid-based resin, acryl-based resin, silicon oxide (SiOx), silicon nitride (SiNx), silicon oxynitride (SiOxNy) and silicon oxycarbide (SiOxCy).

11. A method of manufacturing an organic light emitting display device, comprising:
providing a first substrate;
forming a first electrode on the first substrate;
forming a pixel defining layer on the first electrode and the first substrate, the pixel defining layer defining a display region and a non-display region;
forming an opening exposing the first electrode in the display region by partially etching the pixel defining layer;
forming a fine uneven structure within the pixel defining layer, the fine uneven structure being disposed in the display and the non-display regions, the fine uneven structure comprising pathways for exhaustion of gases from within the opening;
forming an organic light emitting structure on the first electrode;
forming a second electrode on the organic light emitting structure and the pixel defining layer; and
forming a second substrate on the second electrode.

12. The method of claim 11, further comprising forming an underlying structure having a switching device and an insulation layer between the first substrate and the first electrode.

13. The method of claim 11, the step of forming an opening further comprising using an etchant in a wet etching process conducted at a temperature below about 200° C.

14. The method of claim 11, the fine uneven structure being formed on a sidewall of the opening and on the pixel defining layer in the non-display region.

15. The method of claim 11, the step of forming the fine uneven structure comprising contacting a roller having bristles arranged in a predetermined direction with the pixel defining layer while moving the first substrate.

16. The method of claim 11, the step of forming the fine uneven structure comprising irradiating a laser onto the pixel defining layer using a mask having micro holes arranged in a predetermined direction while moving the first substrate.

17. The method of claim 11, the step of forming the fine uneven structure further comprising:
contacting a roller having bristles arranged in a predetermined direction with the pixel defining layer while moving the first substrate in a first direction; and
contacting the roller with the pixel defining layer while moving the first substrate in a second direction different from the first direction.

18. The method of claim 11, the step of forming the fine uneven structure further comprising:
irradiating a laser onto the pixel defining layer using a mask having micro holes arranged in a predetermined direction while moving the first substrate in a first direction; and
irradiating a laser onto the pixel defining layer using the mask while moving the first substrate in a second direction different from the first direction.

19. The method of claim 11, the organic light emitting structure being formed by a laser induced thermal imaging process using a donor substrate having an organic transfer layer.

20. The method of claim 19, at least one of air and a gas in the opening of the pixel defining layer being exhausted through the fine uneven structure in the laser induced thermal imaging process.

* * * * *